US010819348B2

(12) United States Patent
Chen

(10) Patent No.: US 10,819,348 B2
(45) Date of Patent: Oct. 27, 2020

(54) SYSTEM OF REFERENCELESS CLOCK AND DATA RECOVERY AND FREQUENCY DETECTOR THEREOF

(71) Applicant: NATIONAL CHIAO TUNG UNIVERSITY, Hsinchu (TW)

(72) Inventor: Wei-Zen Chen, Zhubei (TW)

(73) Assignee: NATIONAL CHIAO TUNG UNIVERSITY, Hsinchu (TW)

( * ) Notice: Subject to any disclaimer, the term of this patent is extended or adjusted under 35 U.S.C. 154(b) by 0 days.

(21) Appl. No.: 16/403,361

(22) Filed: May 3, 2019

(65) Prior Publication Data

US 2020/0162080 A1  May 21, 2020

(30) Foreign Application Priority Data

Nov. 21, 2018 (TW) .............................. 107141379 A

(51) Int. Cl.
*H03L 7/08* (2006.01)
*H03L 7/099* (2006.01)
*H03L 7/087* (2006.01)

(52) U.S. Cl.
CPC ............ *H03L 7/0807* (2013.01); *H03L 7/087* (2013.01); *H03L 7/099* (2013.01)

(58) Field of Classification Search
None
See application file for complete search history.

(56) References Cited

U.S. PATENT DOCUMENTS

| 7,592,847 B2 * | 9/2009 | Liu ...................... H03D 13/004 |
| | | 327/12 |
| 8,610,476 B1 * | 12/2013 | Soh ........................ H03L 7/0807 |
| | | 327/159 |
| 9,191,187 B2 * | 11/2015 | Shibasaki ............. H04L 7/0079 |
| 10,340,902 B1 * | 7/2019 | Fortier ................... H03L 7/0812 |

(Continued)

OTHER PUBLICATIONS

Rajesh Inti et al.; "A 0.5-to-2.5 Gb/s Reference-Less Half-Rate Digital CDR With Unlimited Frequency Acquisition Range and Improved Input Duty-Cycle Error Tolerance"; IEEE Journal of Solid-State Circuits; vol. 46; No. 12; Dec. 2011.

(Continued)

*Primary Examiner* — Lincoln D Donovan
*Assistant Examiner* — Khareem E Almo
(74) *Attorney, Agent, or Firm* — Muncy, Geissler, Olds & Lowe, P.C.

(57) ABSTRACT

A system of referenceless clock and data recovery and a frequency detector thereof has been provided. The output clock of the system initially works at the lowest frequency, the frequency of the output clock is monotonically increased in accordance with the control of the frequency detector, thereby gradually approximating a target value. The edge extraction circuit receives the data signal and the clock signal, identifies the transition edges of the signals and generates a data transition signal and a clock transition signal representing the transition edges of the data signal and the transition edges of the clock signal respectively. The edge detector then determines the data period of the data signal and the clock period of the clock signal. When the data period is smaller than half of the clock period, the edge detector generates a frequency-up signal and the frequency of the output clock is increased.

12 Claims, 12 Drawing Sheets

(56) References Cited

U.S. PATENT DOCUMENTS

| | | | |
|---|---|---|---|
| 2007/0090881 A1* | 4/2007 | Seefeldt | H03L 7/095 331/1 A |
| 2007/0090887 A1* | 4/2007 | Seefeldt | H03D 13/004 331/17 |
| 2007/0120611 A1* | 5/2007 | Kim | H03L 7/085 331/25 |
| 2009/0074123 A1 | 3/2009 | Hsueh et al. | |
| 2010/0264963 A1* | 10/2010 | Kikuchi | H03L 7/081 327/157 |
| 2015/0270947 A1 | 9/2015 | Tiwari et al. | |
| 2017/0026047 A1* | 1/2017 | Shibasaki | H04L 7/033 |
| 2017/0373697 A1* | 12/2017 | Schober | H03K 3/0315 |
| 2018/0019864 A1* | 1/2018 | Tsunoda | H04L 7/0075 |
| 2018/0083809 A1* | 3/2018 | Tajalli | H04L 25/14 |

OTHER PUBLICATIONS

Guanghua Shu et al.; "a 4-to-10.5Gb/s 2.2mW/Gb/s Continuous-Rate Digital CDR with Automatic Frequency Acquisition in 65nm CMOS"; ISSCC 2014/Session 8/Optical Links and Copper Phys/8.7; 2015 IEEE International Solid-State Circuits Conference.

\* cited by examiner

SYSTEM OF REFERENCELESS CLOCK AND DATA RECOVERY AND FREQUENCY DETECTOR THEREOF

CROSS-REFERENCE TO RELATED APPLICATION

This application claims priority from Taiwan Patent Application No. 107141379, filed on Nov. 21, 2018 in Taiwan Intellectual Property Office, the disclosures of which are hereby incorporated by reference in their entirety for all purposes.

BACKGROUND OF THE INVENTION

1. Field of the Invention

The present invention relates to a system of referenceless clock and data recovery and a frequency detector thereof, especially relating to a system of referenceless clock and data recovery and a frequency detector which monotonically increase the frequency of a clock signal based on an input of a data signal without being affected by the frequency acquisition errors or the data transition density.

2. Description of the Related Art

Consumer electronics and the internet terminal equipment require high speed data link technology to keep up with current trends. In just the last decade, the operation frequency of data transmission interfaces has increased tenfold. To suit the constantly evolving demands for high speed data link technology, many formats or protocols have been widely adopted in consumer electronics, including 100 Gbps Ethernet, USB 3.1 (10 Gbps), PCIe 5.0 (32 Gbps), and MIPI 3.0 (12 Gbps), among other such related medium. Regarding the consumer electronics and internet transceiver systems utilizing high speed data link technology, a clock and data recovery circuit is the core of the transceiver system. The clock and data recovery circuit detects the phase and frequency of the transmitted data, as well as samples the received signal in order to eliminate interference caused by noise and distortion, from which it is typical for the transmitted data to be adversely affected during the transmission process.

When the clock and data recovery system receives data transmitted from different sources, the detection of the edge of the signal must be combined with the clock and data recovery system, and a phase detector is then adopted to conduct the adjustment of the sampling clock. This step is undertaken because the power spectral density of the transmitted data has no power at the data rate. However, because the aforementioned phase detector is adopted to conduct the adjustment of the sampled clock, a frequency-locked loop is further designed to improve the limitations of the frequency acquisition range of which the clock and data recovery system undergoes.

There are two distinct categories in modern frequency-locked loop, the with-reference architecture or the referenceless architecture. FIG. 1 illustrates a schematic architecture diagram of the conventional with-reference clock and data recovery system. As illustrated in FIG. 1, the conventional with-reference architecture of the clock and data recovery system includes a reference input, a frequency-locked loop and a phase detector, in which Loop II begins frequency tracking, and then switched to Loop I for phase tracking after frequency acquisition. When the with-reference clock and data recovery system switches between the frequency tracking loop and the phase tracking loop, the loop filter may need to be reset because the optimized damping factors for the frequency tracking loop and the phase tracking loop may be different. The reset of the loop filter may lead to voltage surges at the input terminal of the oscillator, which will further affect frequency acquisition.

Although the foregoing loops may be utilized to improve the issue of the frequency acquisition range, the problem of the with-reference architecture of the clock and data recovery system is that an extra signal channel is required for clock signal transmission, or an additional crystal oscillator is required for providing a reference signal to the phase frequency detector. Due to the limitation of the package size, the with-reference clock and data recovery system tends to becoming unable to meet the needs of modern circuit designs.

In order to overcome the aforementioned problems, a referenceless clock and data recovery system has been commonly adopted for modern high speed transmission interfaces such as TOSA (transmitter optical sub-assembly) and ROSA (receiver optical sub-assembly) modules, for example, 100 Gbps Ethernet (100 GbE). FIG. 2 illustrates a schematic architecture diagram of a conventional referenceless clock and data recovery system.

The frequency detector in a referenceless clock and data recovery system may be categorized as three types:

The first type of frequency detector is mainly based on the Pöttbacker frequency detector. The schematic of the referenceless clock and data recovery system with the quadricorrelator and the Pöttbacker frequency detector has been disclosed by US2015/0270947 and US2009/0074123, as illustrated in FIG. 3(a) and FIG. 3(b). It should be considered that a quadrature sampling phase is needed in the architecture of this frequency detector, and the frequency acquisition range is less than 25%. Also, the Pöttbacker frequency detector is unable to function properly when receiving an ISI (inter-symbol interference) stressed signal.

The second type of frequency detector utilizes a stochastic frequency divider to conduct frequency detection on the input data (Rajesh Inti, et al., "A 0.5-to-2.5 Gb/s Reference-Less Half-Rate Digital CDR With Unlimited Frequency Acquisition Range and Improved Input Duty-Cycle Error Tolerance", *JSSC*, pp. 3150-3162, December 2011). However, similar to US2009/0074123, the frequency acquisition error of the second type frequency detector is influenced by the data pattern and the transition density. The statistical accumulator is unable to function properly when receiving an ISI (inter-symbol interference) stressed signal.

The third type of frequency detector is a randomly sampling phase detector (Guanghua Shu, et al, "A 4-to-10.5 Gb/s 2.2 mW/Gb/s Continuous-Rate Digital CDR with Automatic Frequency Acquisition in 65 nm CMOS", ISSCC, pp. 150-151, February 2014). In a randomly sampling phase detector, the input data is utilized for conducting a random sampling based on a clock signal. The frequency of the clock signal is increased or decreased based on a statistical operation conducted on the input data leads or lags of the clock signal. When the value reaches a critical amount, or the value does not reach a critical amount, the frequency of the clock signal is affected. In any case, one problem affecting the random sampling phase detector is that the designated critical amount is very sensitive to the data pattern and the transition density, such that leading or lagging errors may be very common in the resulting continuous data generated by such systems when receiving an ISI (inter-symbol interference) stressed signal.

SUMMARY OF THE INVENTION

In view of the aforementioned problems, the present invention aims to provide a system of referenceless clock and data recovery and frequency detector thereof to solve the problems encountered in prior art.

On the basis of the purpose as mentioned above, the present invention has provided a frequency detector suitable for a clock and data recovery system to monotonically increase the frequency of a clock signal outputted by the clock and data recovery system. The frequency detector comprises an extraction circuit and a determination circuit. The extraction circuit receives a data signal and a clock signal, and from there distinguishes a plurality of data transition edges of the data signal and a plurality of clock transition edges of the clock signal. The extraction circuit respectively generates two signals: a data transition signal representing the plurality of data transition edges, and a clock transition signal representing the plurality of clock transition edges. The determination circuit is connected to the extraction circuit and receives the data transition signal and the clock transition signal. The determination circuit respectively determines a data signal period of the data signal and a clock signal period of the clock signal based on the data transition signal and the clock transition signal. When the data signal period is less than a half of the clock signal period, the determination circuit generates a frequency-up conversion signal and the clock and data recovery system increases the frequency of the clock signal based on the result of the frequency-up conversion signal.

Preferably, the determination circuit defines two of the plurality of data transition edges adjacent to each other as data transition intervals and two of the plurality of clock transition edges adjacent to each other as clock transition intervals based on the data transition signal and the clock transition signal. In the condition that any of the clock transition intervals encompasses the data transition intervals on the time axis, the determination circuit generates the frequency-up conversion signal.

Preferably, the plurality of data transition edges are respectively data rising edges or data falling edges, whereas the plurality of clock transition edges are respectively clock rising edges or clock falling edges. In the condition where one of the clock rising edges or the clock falling edges leads a data rising edge or a data falling edge and the clock falling edge or the clock rising edge adjacent to the clock rising edge or the clock falling edge lags the data falling edge or the data rising edge adjacent to the data rising edge or the data falling edge, the determination circuit generates a frequency-up conversion signal.

Preferably, the determination circuit generates the frequency-up conversion signal when satisfying one of the following conditions or a combination thereof as below: (1) the first condition: the clock rising edge leads the data rising edge, and the clock falling edge adjacent to the clock rising edge lags the data falling edge adjacent to the data rising edge; (2) the second condition: the clock falling edge leads the data rising edge, and the clock rising edge adjacent to the clock falling edge lags the data falling edge adjacent to the data rising edge; (3) the third condition: the clock rising edge leads the data falling edge, and the clock falling edge adjacent to the clock rising edge lags the data rising edge adjacent to the data falling edge; (4) the fourth condition: the clock falling edge leads the data falling edge, and the clock rising edge adjacent to the clock falling edge lags the data rising edge adjacent to the data falling edge.

Preferably, the extraction circuit further comprises a first D flip-flop, a first negative-edge-triggered D flip-flop, a second D flip-flop, a second negative-edge-triggered D flip-flop and a first AND gate. The first D flip-flop comprises a first data input terminal, a first clock input terminal, a first temporary data output terminal and a first reset gate. The first data input terminal is connected to the high voltage terminal and the first clock input terminal receives the data signal. The first negative-edge-triggered D flip-flop comprises a first negative-edge-triggered D flip-flop data input terminal, a first negative-edge-triggered D flip-flop clock input terminal, a first negative-edge-triggered D flip-flop data output terminal and a first negative-edge-triggered D flip-flop reset gate. The first negative-edge-triggered D flip-flop data input terminal is connected to the first temporary data output terminal and the first negative-edge-triggered D flip-flop clock input terminal receives the data signal. The second D flip-flop comprises a second data input terminal, a second clock input terminal, a second temporary data output terminal and a second reset gate. The second data input terminal is connected to the high voltage terminal. The second clock input terminal receives the clock signal and the first reset gate is connected to the second reset gate. The second negative-edge-triggered D flip-flop comprises a second negative-edge-triggered D flip-flop data input terminal, a second negative-edge-triggered D flip-flop clock input terminal, a second negative-edge-triggered D flip-flop data output terminal and a second negative-edge-triggered D flip-flop reset gate. The second negative-edge-triggered D flip-flop data input terminal is connected to the second temporary data output terminal. The second negative-edge-triggered D flip-flop clock input terminal receives the clock signal and the second negative-edge-triggered D flip-flop reset gate is connected to the first negative-edge-triggered D flip-flop reset gate. The first AND gate is provided with a first AND gate first input terminal, a first AND gate second input terminal and a first AND gate output terminal. The first AND gate first input terminal is connected to the first negative-edge-triggered D flip-flop data output terminal. The first AND gate second input terminal is connected to the second negative-edge-triggered D flip-flop data output terminal, and the first AND gate output terminal is connected to the first reset gate, the second reset gate, the first negative-edge-triggered D flip-flop reset gate and the second negative-edge-triggered D flip-flop reset gate.

Preferably, the determination circuit further comprises a third D flip-flop, a fourth D flip-flop and a second AND gate. The third D flip-flop comprises a third data input terminal, a third clock input terminal, a third temporary data output terminal and a third reset gate. The third data input terminal is connected between the second temporary data output terminal and the second negative-edge-triggered D flip-flop data input terminal. The third clock input terminal is connected between the first temporary data output terminal and the first negative-edge-triggered D flip-flop data input terminal. The fourth D flip-flop comprises a fourth data input terminal, a fourth clock input terminal, a fourth temporary data output terminal and a fourth reset gate. The fourth data input terminal is connected between the first negative-edge-triggered D flip-flop data output terminal and the first AND gate first input terminal. The fourth clock input terminal is connected between the second negative-edge-triggered D flip-flop data output terminal and the first AND gate second input terminal. The third reset gate is connected to the fourth reset gate. The second AND gate is provided with a second AND gate first input terminal, a second AND gate second input terminal and a second AND gate output terminal. The second AND gate second input terminal is connected to the third temporary data output terminal. The second AND gate first input terminal is connected to the fourth temporary data output terminal, and the second AND gate output terminal outputs the frequency-up conversion signal.

On the basis of the purpose as mentioned above, the present invention provides a referenceless clock and data recovery system, and the referenceless clock and data recovery system comprises a voltage-controlled oscillator, an extraction circuit and a determination circuit. The voltage-controlled oscillator generates a clock signal. The extraction circuit receives a data signal and a clock signal, and from there distinguishes a plurality of data transition edges of the data signal and a plurality of clock transition edges of the clock signal. The extraction circuit respectively generates a data transition signal representing the plurality of data transition edges and a clock transition signals representing the plurality of clock transition edges. The determination circuit is connected to the extraction circuit and receives the data transition signal and the clock transition signal. The determination circuit respectively determines a data signal period of the data signal and a clock signal period of the clock signal based on the data transition signal and the clock transition signal. When the data signal period is less than a half of the clock signal period, the determination circuit generates a frequency-up conversion signal and provides the frequency-up conversion signal to the voltage-controlled oscillator, such that the frequency of the clock signal generated by the voltage-controlled oscillator is monotonically increased according to the frequency-up conversion signal.

Preferably, the determination circuit defines two of the plurality of data transition edges adjacent to each other as data transition intervals and two of the plurality of clock transition edges adjacent to each other as clock transition intervals based on the data transition signal and the clock transition signal, and when any of the clock transition intervals encompasses the data transition intervals on the time axis, the determination circuit generates a frequency-up conversion signal.

Preferably, the plurality of data transition edges are respectively data rising edges or data falling edges, whereas the plurality of clock transition edges are respectively clock rising edges or clock falling edges. In the condition that any one of the clock rising edges or the clock falling edges leads the data rising edges or the data falling edges and the clock falling edges or the clock rising edges adjacent to the clock rising edges or the clock falling edges lags the data falling edge or the data rising edges adjacent to the data rising edges or the data falling edges, the determination circuit generates the frequency-up conversion signal.

Preferably, the determination circuit generates the frequency-up conversion signal when satisfying one of the following conditions or a combination thereof as below: (1) the first condition: the clock rising edge leads the data rising edge, and the clock falling edge adjacent to the clock rising edge lags the data falling edge adjacent to the data rising edge; (2) the second condition: the clock falling edge leads the data rising edge, and the clock rising edge adjacent to the clock falling edge lags the data falling edge adjacent to the data rising edge; (3) the third condition: the clock rising edge leads the data falling edge, and the clock falling edge adjacent to the clock rising edge lags the data rising edge adjacent to the data falling edge; (4) the fourth condition: the clock falling edge leads the data falling edge, and the clock rising edge adjacent to the clock falling edge lags the data rising edge adjacent to the data falling edge.

On the basis of the purpose as mentioned above, the present invention provides a referenceless clock and data recovery system. The referenceless clock and data recovery system comprises a multiple phase oscillator, a pulse signal generator and a pulse signal determination circuit. The multiple phase oscillator generates a plurality of phase signals during a period. The pulse signal generator generates a plurality of pulse signals based on the plurality of phase signals. The pulse signal determination circuit is communicatively connected to the pulse signal generator and receives a data signal. When a pulse width of the pulse signal generated by the pulse signal generator encompasses a pulse width of the data signal, the pulse signal determination circuit generates a frequency-up conversion signal, which is then provided to the multiple phase oscillator. The frequency of the plurality of phase signals generated by the multiple phase oscillator is monotonically increased based on the frequency-up conversion signal.

Preferably, the pulse signal generator comprises an extraction circuit constituted of a plurality of AND gates.

In light of the aforementioned embodiments, the present invention has the following advantages:

1. The frequency acquisition error of the system of referenceless clock and data recovery and frequency detector thereof is not influenced by the data pattern and the run length.

2. The frequency acquisition error of the system of referenceless clock and data recovery and frequency detector thereof of is not influenced by transition density.

3. The frequency acquisition range of the system of referenceless clock and data recovery and frequency detector thereof is only limited to the frequency adjustment range of the voltage-controlled oscillator.

4. The frequency acquisition range of the system of referenceless clock and data recovery and frequency detector thereof may still conduct frequency acquisition when receiving an ISI (inter-symbol interference) stressed signal.

5. The frequency acquisition range of the system of referenceless clock and data recovery and frequency detector thereof may still conduct a Baud Rate operation because there is no need for sampling the IQ phase of the clock signal.

DESCRIPTION OF THE PREFERRED EMBODIMENTS

The advantages, features, and technical methods of the present invention are to be explained in detail with reference to the exemplary embodiments and the figures for the purpose of being more easily to be understood. Moreover, the present invention may be realized in different forms, and should not be construed as being limited to the embodiments set forth herein. Conversely, for a person skilled in the art, the embodiments provided shall make the present invention convey the scope more thoroughly, comprehensively, and completely. In addition, the present disclosure shall be defined only by the appended claims.

Figure 1:
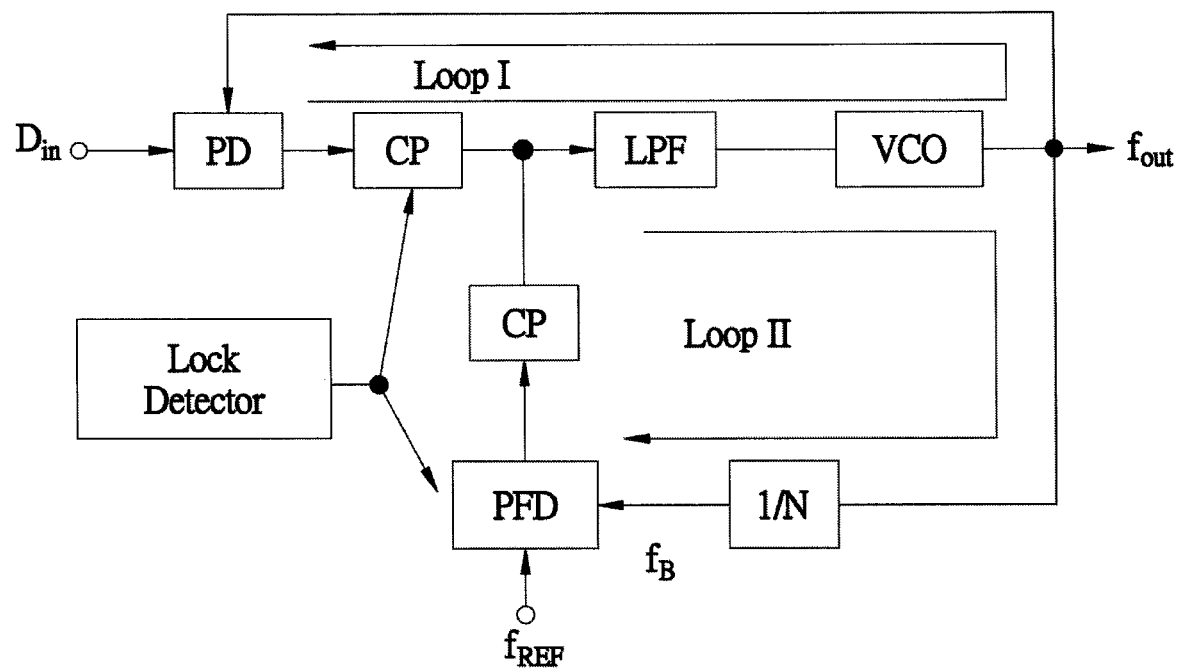
FIG. 1 illustrates a schematic architecture diagram of the conventional reference clock and data recovery system with the frequency-locked loop and phase detector.
Figure 2:
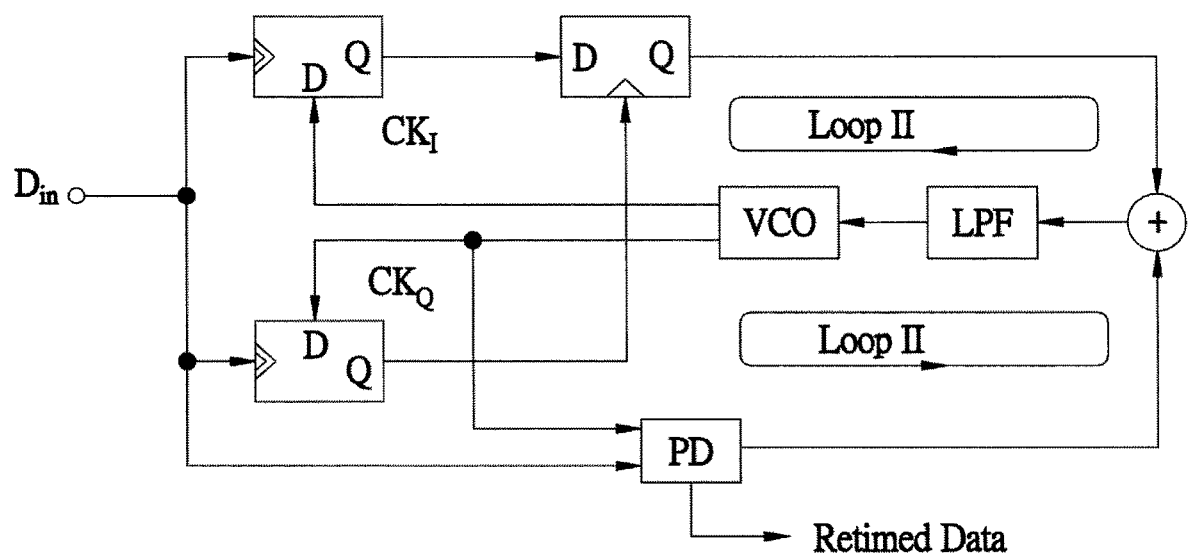
FIG. 2 illustrates a schematic architecture diagram of the conventional referenceless clock and data recovery system.
Figure 3A:
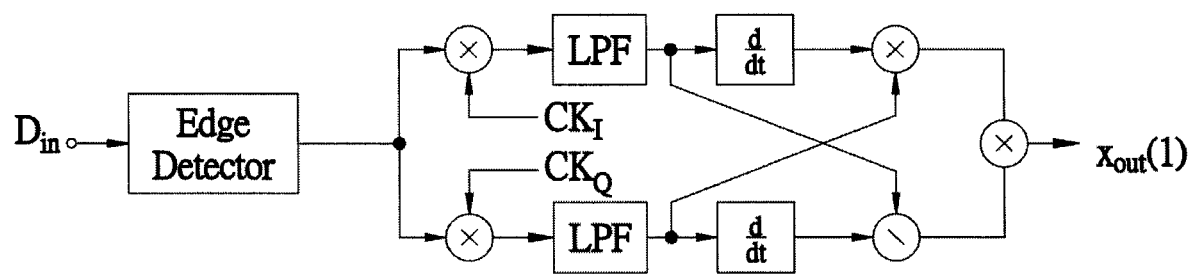
FIG. 3(a) illustrates a schematic architecture diagram of the conventional reference clock and data recovery system with quadricorrelator.
Figure 3B:
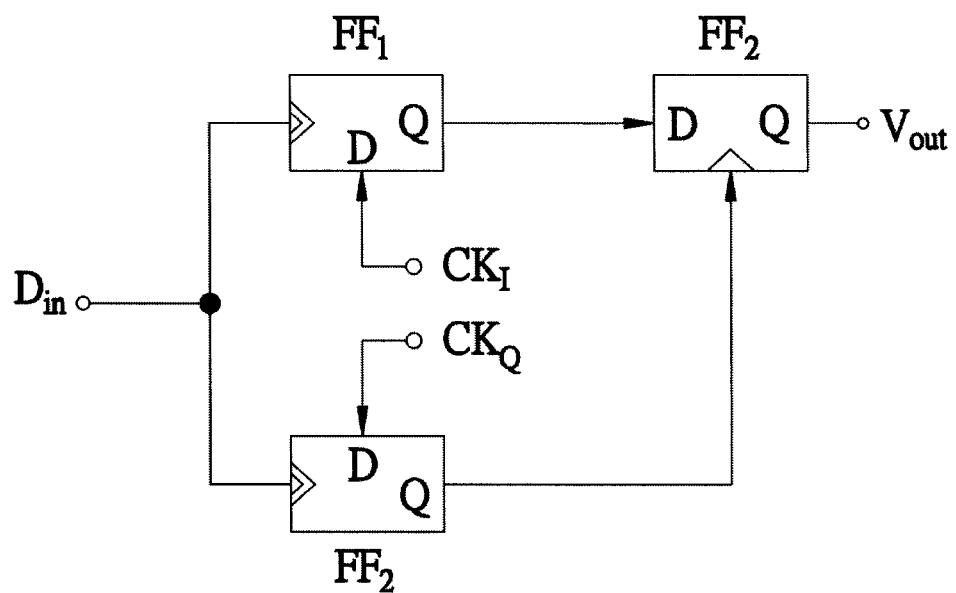
FIG. 3(b) illustrates a schematic architecture diagram of the Pöttbacker frequency detector.
Figure 4:
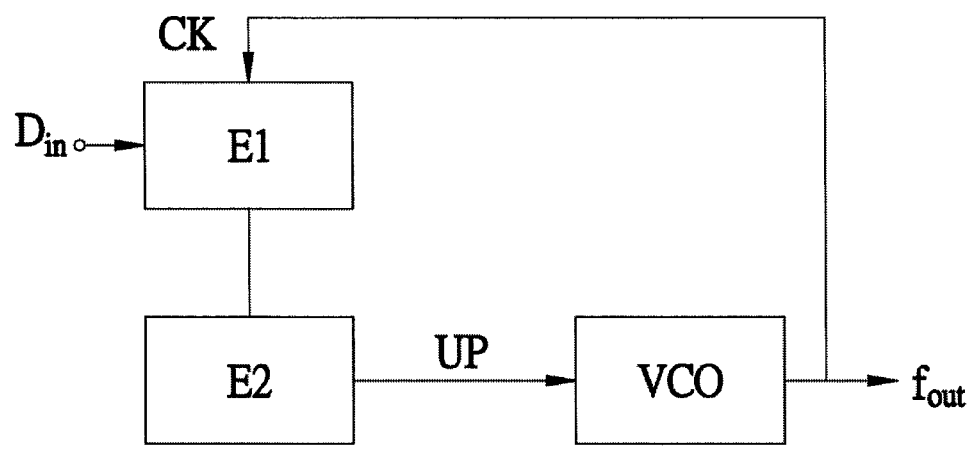
FIG. 4 illustrates a schematic block diagram of the clock and data recovery system according to the embodiment of the present invention.

Please refer to FIG. 4, which illustrates a schematic block diagram of the clock and data recovery system according to the embodiment of the present invention. As FIG. 4 has illustrated, the clock and data recovery system R comprises an extraction circuit E1, a determination circuit E2 and a voltage-controlled oscillator VCO. Wherein, the output clock signal CK of the voltage-controlled oscillator VCO operates at the lowest frequency thereof. After that, the frequency detector composed of the extraction circuit E1 and the determination circuit E2 is used for controlling the voltage-controlled oscillator VCO to step by step increase the output voltage thereof. The output clock signal CK of the voltage-controlled oscillator VCO is monotonically increased and approaches the desired value. In another embodiment of the present invention, a charge pump CP is present between the determination circuit E2 and the voltage-controlled oscillator VCO. The determination circuit E2 increases the output voltage of the voltage-controlled oscillator VCO through use of the charge pump.

Figure 5:
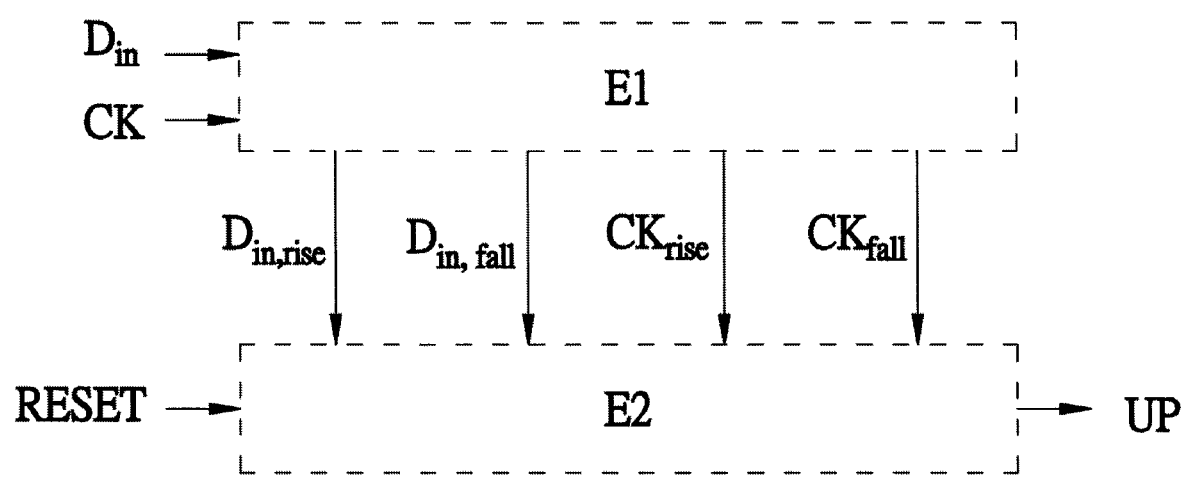
FIG. 5 illustrates a schematic block diagram of the frequency detector according to the embodiment of the present invention.

Please further refer to FIG. 5, which illustrates a schematic block diagram of the frequency detector according to the embodiment of the present invention. As FIG. 5 has illustrated, the extraction circuit E1 receives the data signal Din and the clock signal CK, and from there distinguishes a plurality of data transition edges of the data signal Din and a plurality of clock transition edges of the clock signal CK. The extraction circuit E1 respectively generates a data transition signal representing the plurality of data transition edges and a clock transition signal representing the plurality of clock transition edges.

The determination circuit E2 is connected to the extraction circuit E1 and receives the data transition signal and the clock transition signal. The determination circuit E2 respectively determines a data signal period $T_{Din}$ of the data signal Din and a clock signal period $T_{CK}$ of the clock signal CK based on the data transition signal and the clock transition signal. According to the relative position of the data transition signal and the clock transition signal, the frequency-up conversion signal UP of the frequency detector 1 is generated. Wherein, the data transition signal comprises: a data rising signal $D_{in,rise}$ and a data falling signal $D_{in,fall}$; the clock transition signal comprises: a clock rising signal $CK_{rise}$ and a clock falling signal $CK_{fall}$.

Taking a half rate frequency detector as an example, half of clock signal period $T_{CK}/2$ approximates the time length of the data signal period $T_{Din}$ in the state of frequency acquisition. Hence, under the condition that the frequency of the clock signal CK lags the desired frequency of the data signal, half of clock signal period $T_{CK}/2$ is more than the time length of the data signal period $T_{Din}$ ($T_{CK}/2 > T_{Din}$). Namely, half of clock signal period $T_{CK}/2$ may encompass the shortest pulse (the minimum data signal period $T_{Din}$). In other words, when the frequency of the clock signal CK leads the desired frequency of the data signal, half of clock signal period $T_{CK}/2$ is less than the time length of the data signal period $T_{Din}$ ($T_{CK}/2 < T_{Din}$). In this way, half of clock signal period $T_{CK}/2$ does not have a chance to encompass the shortest pulse (the minimum data signal period $T_{Din}$). The frequency-up conversion signal UP of the frequency detector 1 is disabled, and the frequency detector 1 in the clock and data recovery system R is not influenced. In a condition that the input data is a series of "1" or "0", half of clock signal period $T_{CK}/2$ does not encompass the data and the frequency-up conversion signal UP is not outputted. Since the frequency detector 1 does not output the frequency-down conversion signal, the problem about the modifying the frequency error may be avoided when receiving a long run of "1" or "0".

Wherein, the frequency detector repeatedly conducts the frequency acquisition in a manner similar to a loop. For example, when implementing in manner of event trigger, the reset signal is generated for resetting the extraction circuit E1 and the determination circuit E2 after the frequency-up conversion signal UP of the frequency detector 1 is generated. The frequency-up conversion signal UP is generated again until the relative position of the data edge and the clock edge meeting the sense logic has appeared. Wherein, the cycle of generating the frequency-up conversion signal UP is a determination cycle. Moreover, when implementing in the loop manner, and using a time trigger as the example, a reset signal is generated in every time interval. In every time interval, the determination circuit E2 may determine whether to generate the frequency-up conversion signal UP based on the relative position of the data edge and the clock edge. Namely, when the data signal period $T_{Din}$ is less than half of clock signal period $T_{CK}/2$ in each determination cycle, the determination circuit E2 generates the frequency-up conversion signal UP. Afterwards, the frequency detector is reset again and reenters the next determination cycle.

In the embodiment of the present invention, the determination circuit E2 defines two of the plurality of data transition edges adjacent to each other as a data transition intervals and two of the plurality of clock transition edge adjacent to each other as a clock transition intervals based on the data transition signal and the clock transition signal, and when any of the clock transition intervals may encompass the data transition intervals on the time axis, the determination circuit E2 generates the frequency-up conversion signal UP.

Wherein, the data transition edge comprises: a data rising edge $D_{up}$ and a data falling edge $D_{dn}$; the clock transition edge comprises: a clock rising edge $CK_{up}$ and a clock falling edge $CK_{dn}$. When any one of the clock rising edge $CK_{up}$ or the clock falling edge $CK_{dn}$ leads the data rising edge $D_{up}$ or the data falling edge $D_{dn}$ and the clock falling edge $CK_{dn}$ or the clock rising edge $CK_{up}$ adjacent to the clock rising edge $CK_{up}$ or the clock falling edge $CK_{dn}$ lags the data falling edge $D_{dn}$ or the data rising edge $D_{up}$ adjacent to the data rising edge $D_{up}$ or the data falling edge $D_{dn}$, the determination circuit E2 generates the frequency-up conversion signal UP.

Figure 6:
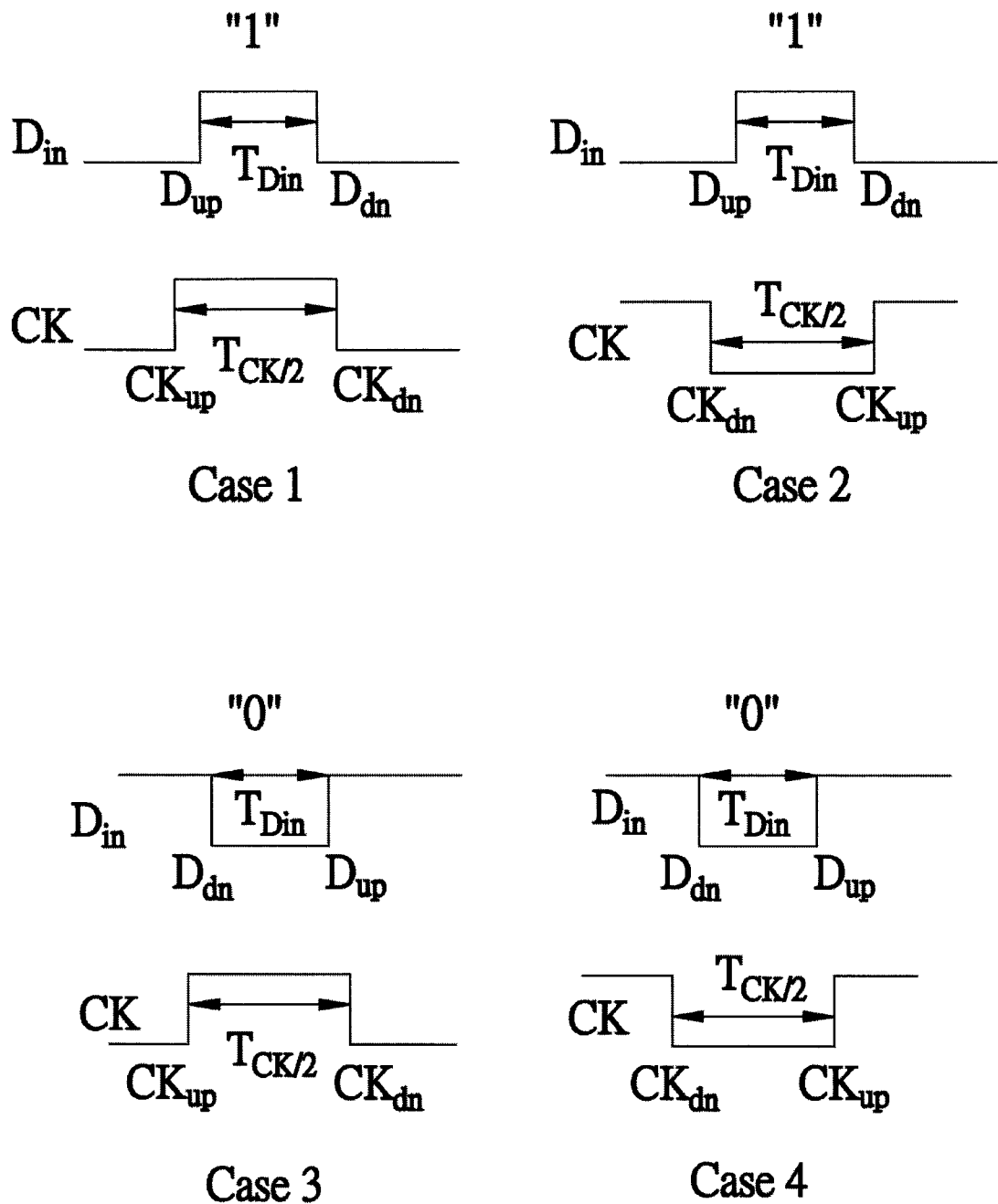
FIG. 6 illustrates a schematic principle diagram of the frequency detector according to the embodiment of the present invention.

Please further refer to FIG. 6, which illustrates a schematic principle diagram of the frequency detector according to the embodiment of the present invention. As FIG. 6 has illustrated, the FIG. 6 reveals the four conditions that the data signal period $T_{Din}$ is less than half of clock signal period $T_{CK}/2$ as below:

(1) The first condition Case 1: the clock rising edge $CK_{up}$ leads the data rising edge $D_{up}$, and the clock falling edge $CK_{dn}$ adjacent to the clock rising edge $CK_{up}$ lags the data falling edge $D_{dn}$ adjacent to the data rising edge $D_{up}$.

(2) The second condition Case 2: the clock falling edge $CK_{dn}$ leads the data rising edge $D_{up}$, and the clock rising edge $CK_{up}$ adjacent to the clock falling edge $CK_{dn}$ lags the data falling edge $D_{dn}$ adjacent to the data rising edge $D_{up}$.

(3) The third condition Case 3: the clock rising edge $CK_{up}$ leads the data falling edge $D_{dn}$, and the clock falling edge $CK_{dn}$ adjacent to the clock rising edge $CK_{up}$ lags the data rising edge $D_{up}$ adjacent to the data falling edge $D_{dn}$.

(4) The fourth condition Case 4: the clock falling edge $D_{dn}$ leads the data falling edge $D_{dn}$, and the clock rising edge $CK_{up}$ adjacent to the clock falling edge $CK_{dn}$ lags the data rising edge $D_{up}$ adjacent to the data falling edge $D_{dn}$.

Figure 7:
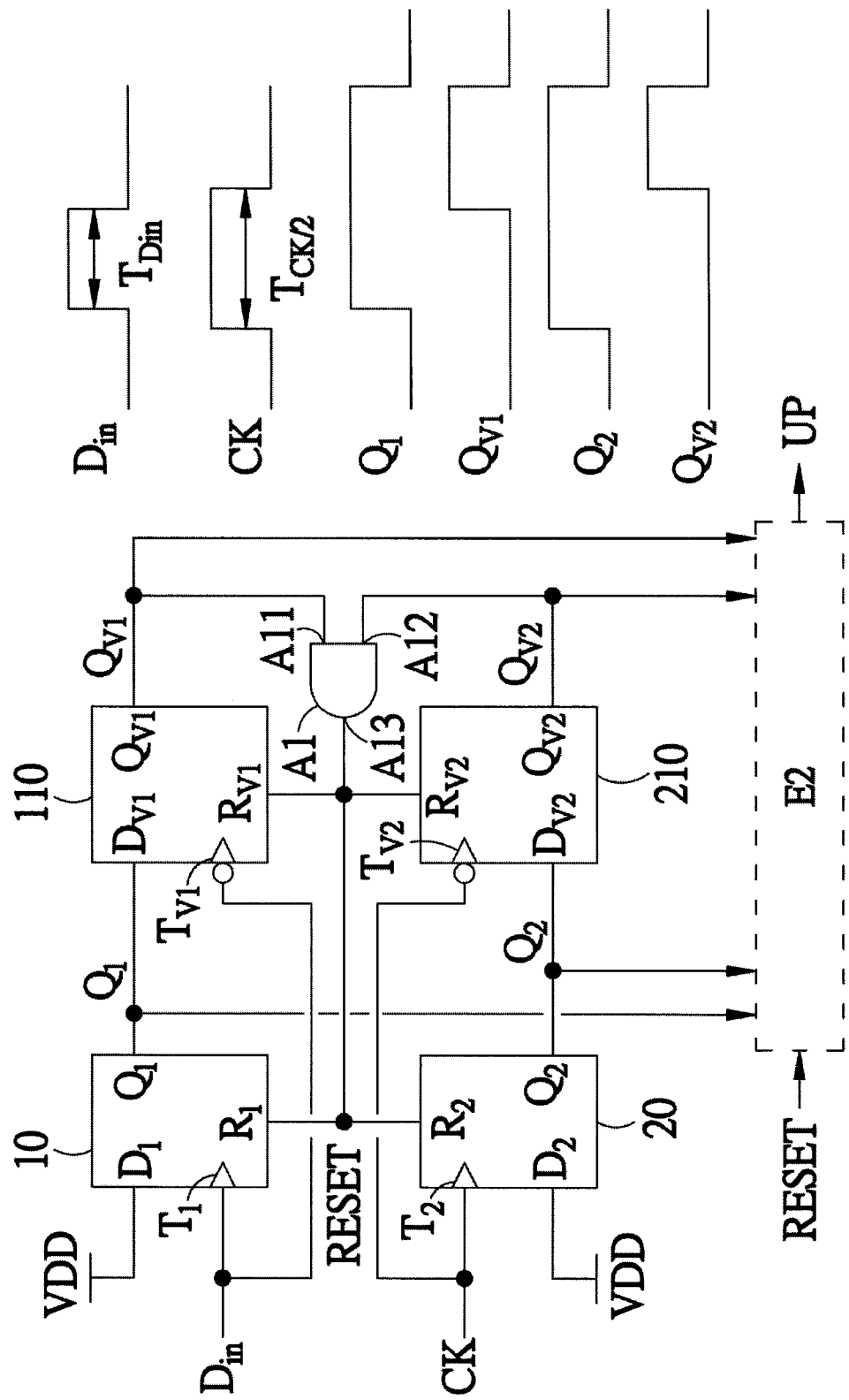
FIG. 7 illustrates a circuit diagram and a signal clock diagram of the frequency detector according to the embodiment of the present invention.

Please further refer to FIG. 7, which illustrates a circuit diagram and a signal clock diagram of the frequency detector according to the embodiment of the present invention. The extraction circuit E1 further comprises a first D flip-flop 10, a first negative-edge-triggered D flip-flop 110, a second D flip-flop 20, a second negative-edge-triggered D flip-flop 210 and a first AND gate A1. Wherein, the first D flip-flop 10 comprises a first data input terminal $D_1$, a first clock input terminal $T_1$, a first temporary data output terminal $Q_1$ and a first reset gate $R_1$. In the equivalent circuit of the frequency detector illustrated by FIG. 7, the first data input terminal $D_1$ is connected to the high voltage terminal VDD and the first clock input terminal $T_1$ receives the data signal $D_{in}$. Wherein, the first negative-edge-triggered D flip-flop 110 comprises a first negative-edge-triggered D flip-flop data input terminal $D_{V1}$, a first negative-edge-triggered D flip-flop clock input terminal $T_{V1}$, a first negative-edge-triggered D flip-flop data output terminal $Q_{V1}$ and a first negative-edge-triggered D flip-flop reset gate $R_{V1}$. In the equivalent circuit of the frequency detector illustrated by FIG. 7, the first negative-edge-triggered D flip-flop data input terminal $D_{V1}$ is connected to the first temporary data output terminal $Q_1$ and the first negative-edge-triggered D flip-flop clock input terminal $T_{V1}$ receives the data signal $D_{in}$. Wherein, the second D flip-flop comprises a second data input terminal $D_2$, a second clock input terminal $T_2$, a second temporary data output terminal $Q_2$ and a second reset gate $R_2$. In the equivalent circuit of the frequency detector illustrated by FIG. 7, the second data input terminal $D_2$ is connected to the high voltage terminal VDD. The second clock input terminal $T_2$ receives the clock signal CK and the first reset gate $R_1$ is connected to the second reset gate $R_2$. Wherein, the second negative-edge-triggered D flip-flop 210 comprises a second negative-edge-triggered D flip-flop data input terminal $D_{V2}$, a second negative-edge-triggered D flip-flop clock input terminal $T_{V2}$, a second negative-edge-triggered D flip-flop data output terminal $Q_{V2}$ and a second negative-edge-triggered D flip-flop reset gate $R_{V2}$. In the equivalent circuit of the frequency detector illustrated by FIG. 7, the second negative-edge-triggered D flip-flop data input terminal $D_{V2}$ is connected to the second temporary data output terminal $Q_2$. The second negative-edge-triggered D flip-flop clock input terminal $T_{V2}$ receives the clock signal CK and the second negative-edge-triggered D flip-flop reset gate $R_{V2}$ is connected to the first negative-edge-triggered D flip-flop reset gate $R_{V2}$. Wherein, the first AND gate A1 is provided with a first AND gate first input terminal A11, a first AND gate second input terminal A12 and a first AND gate output terminal A13. In the equivalent circuit of the frequency detector illustrated by FIG. 7, the first AND gate first input terminal A11 is connected to the first negative-edge-triggered D flip-flop data output terminal $Q_{V1}$. The first AND gate second input terminal A12 is connected to the second negative-edge-triggered D flip-flop data output terminal $Q_{V2}$, and the first AND gate output terminal A13 is connected to the first reset gate $R_1$, the second reset gate $R_2$, the first negative-edge-triggered D flip-flop reset gate $R_{V1}$ and the second negative-edge-triggered D flip-flop reset gate $R_{V2}$.

In detail, as the signal clock diagram of the frequency detector of the embodiment of the present invention depicted by FIG. 7, the data signal $D_{in}$ and the clock signal CK meets the first condition: under the condition that the clock rising edge $CK_{up}$ leads the data rising edge $D_{up}$, and the clock falling edge $CK_{dn}$ adjacent to the clock rising edge $CK_{up}$ lags the data falling edge $D_{dn}$ adjacent to the data rising edge $D_{up}$, the signal diagram of the first temporary data output terminal $Q_1$, the first negative-edge-triggered D flip-flop data output terminal $Q_{V1}$, the second temporary data output terminal $Q_2$ and the second negative-edge-triggered D flip-flop data output terminal $Q_{V2}$ is further disclosed.

Figure 8:
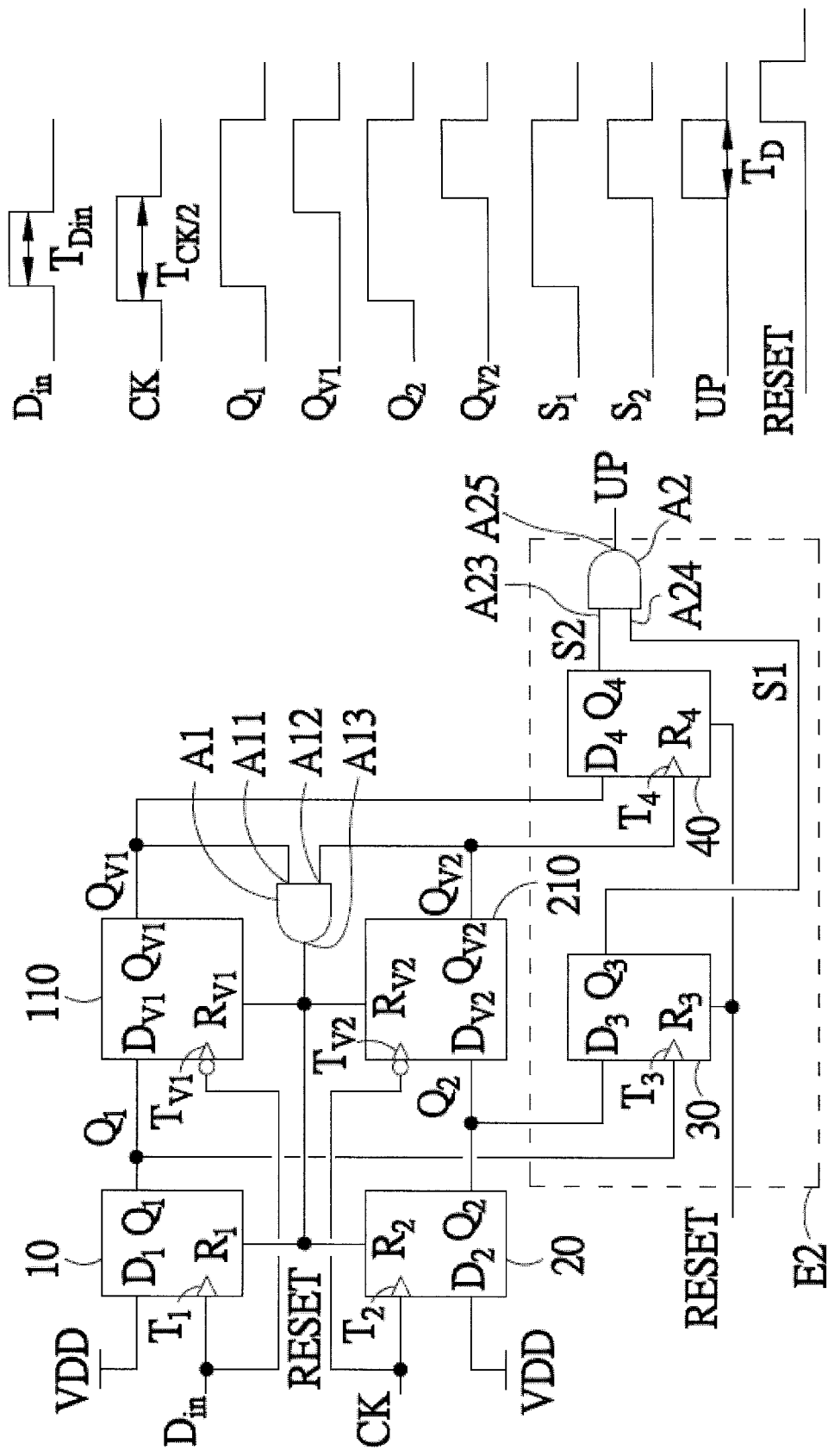
FIG. 8 illustrates a circuit diagram and a signal clock diagram of the frequency detector according to the embodiment of the present invention.

Please further refer to FIG. 8, which illustrates a circuit diagram and a signal clock diagram of the frequency detector according to the embodiment of the present invention. Wherein, the equivalent circuit of the frequency detector illustrated by FIG. 8 has further disclosed that the determination circuit E2 is connected to the extraction circuit E1 disclosed by FIG. 7 and the connection method thereof. Wherein the determination circuit E2 comprises a third D flip-flop 30, a fourth D flip-flop 40 and a second AND gate A2.

In detail, the third D flip-flop 30 comprises a third data input terminal $D_3$, a third clock input terminal $T_3$, a third temporary data output terminal $Q_3$ and a third reset gate $R_3$. In the equivalent circuit of the frequency detector illustrated by FIG. 8, the third data input terminal $D_3$ is connected between the second temporary data output terminal $Q_2$ and the second negative-edge-triggered D flip-flop data input terminal $D_{V2}$. The third clock input terminal $T_3$ is connected between the first temporary data output terminal $Q_1$ and the first negative-edge-triggered D flip-flop data input terminal $D_{V1}$. Moreover, the fourth D flip-flop 40 comprises a fourth data input terminal $D_4$, a fourth clock input terminal $T_4$, a fourth temporary data output terminal $Q_4$ and a fourth reset gate $R_4$. In the equivalent circuit of the frequency detector illustrated by FIG. 8, the fourth data input terminal $D_4$ is connected between the first negative-edge-triggered D flip-flop data output terminal $Q_{V1}$ and the first AND gate first input terminal A11. The fourth clock input terminal $T_4$ is connected between the second negative-edge-triggered D flip-flop data output terminal $Q_{V2}$ and the first AND gate second input terminal A12. The third reset gate $R_3$ is connected to the fourth reset gate $R_4$. Wherein, the second AND gate A2 is provided with a second AND gate first input terminal A23, a second AND gate second input terminal A24 and a second AND gate output terminal A25. In the equivalent circuit of the frequency detector illustrated by FIG. 8, the second AND gate second input terminal A24 is connected to the third temporary data output terminal $Q_3$. The second AND gate first input terminal A23 is connected to the fourth temporary data output terminal $Q_4$, and the second AND gate A25 output terminal outputs the frequency-up conversion signal UP.

As the signal clock diagram of the frequency detector of the embodiment of the present invention depicted by FIG. 8, under the condition that the data signal D and the clock signal CK meets the first condition, the first junction point S1 between the second AND gate second input terminal A24 and the third temporary data output terminal $Q_3$, the second junction point S2 between the second AND gate first input terminal A23 and the fourth temporary data output terminal $Q_4$ and the signal clock diagram of the frequency-up conversion signal UP is further disclosed in addition to the clock diagram of the first temporary data output terminal $Q_1$, the first negative-edge-triggered D flip-flop data output terminal $Q_{V1}$, the second temporary data output terminal $Q_2$ and the second negative-edge-triggered D flip-flop data output terminal $Q_{V2}$.

Please refer to FIG. 4 again. In the clock and data recovery system illustrated by FIG. 4, the clock and data recovery system R at least comprises the voltage-controlled oscillator VCO connected to the determination circuit E2. The voltage-controlled oscillator VCO receives the frequency-up conversion signal UP to adjust the frequency of the clock signal CK and feeds the clock signal CK back to the extraction circuit E1. In another embodiment of the present invention, there may be a charge pump disposed between the determination circuit E2 and the voltage-controlled oscillator VCO. The charge pump may receive the frequency-up conversion signal UP and generate the voltage signal accordingly. The voltage-controlled oscillator VCO adjusts the frequency of the clock signal CK based on the voltage signal.

Figure 9:
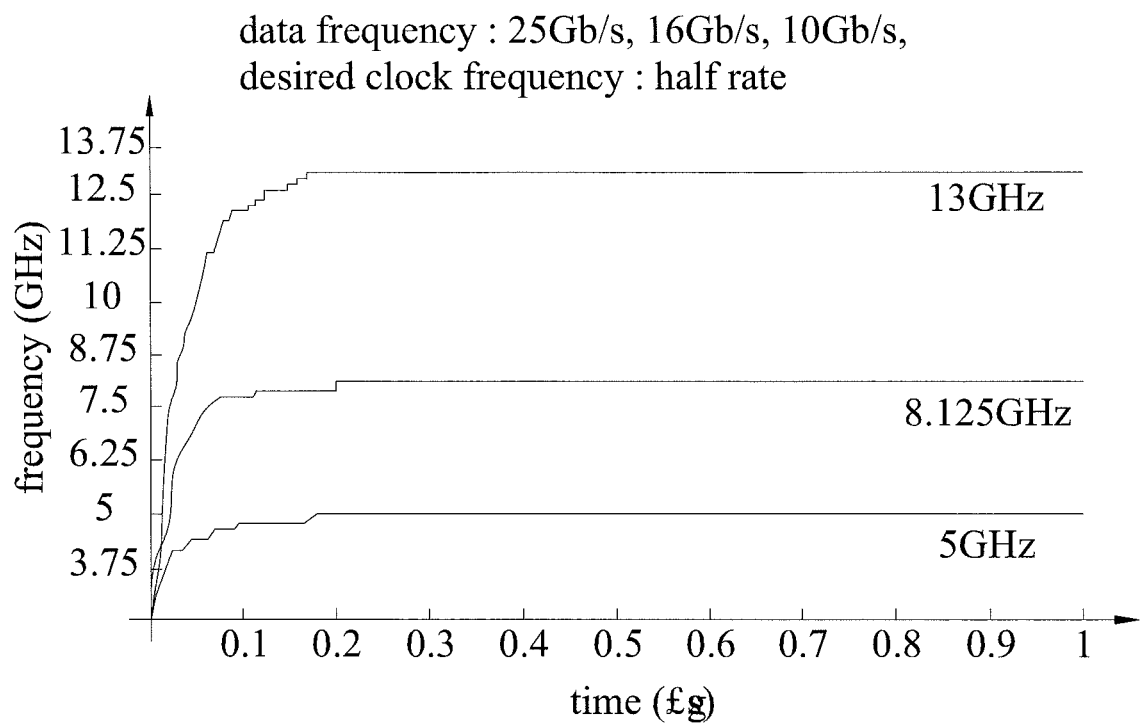
FIG. 9 illustrates a frequency versus time diagram of the frequency detector according to the embodiment of the present invention.

Please further refer to FIG. 9, which illustrates a frequency versus time diagram of the frequency detector according to the embodiment of the present invention. FIG. 9 respectively illustrates the frequency acquisition under the ISI channel of which the input is the random input data frequency of 25 Gbps, 16 Gbps and 10 Gbps. As FIG. 9 has illustrated, in the 200 ns, the frequency acquisition error under the ISI channel which input is the random input data frequency of 25 Gbps, 16 Gbps and 10 Gbps is 4%, 1.5% and 0% respectively. These frequency acquisition errors are less than the current range of frequency acquisition of the frequency detector.

The concepts of the present invention also may be applied to full-rate frequency detectors, or multi-phase frequency detectors for use in a deceleration operation.

Figure 10:
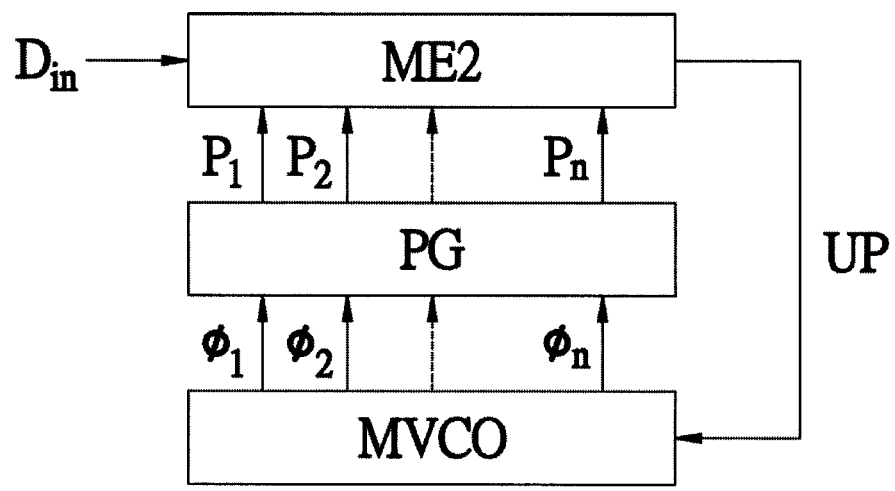
FIG. 10 illustrates a schematic block diagram of the referenceless clock and data recovery system according to the embodiment of the present invention.

Please further refer to FIG. 10, which illustrates a schematic block diagram of the referenceless clock and data recovery system according to the embodiment of the present invention. As FIG. 10 illustrated, the referenceless clock and data recovery system of the present invention comprises a multiphase voltage-controlled oscillator MVCO, a pulse generator PG and a pulse signal determination circuit ME2. Wherein, the multiphase voltage-controlled oscillator MVCO generates n phase signals $\phi_1, \phi_2, \ldots, \phi_n$ during a period $T_{MVCO}$. The pulse signal generator PG generates n pulse signals $P_1, P_2, \ldots, P_n$ based on the n phase signals $\phi_1, \phi_2, \ldots, \phi_n$. The pulse signal determination circuit ME2 generates the frequency-up conversion signal UP based on the n pulse signals $P_1, P_2, \ldots, P_n$ and the data signal $D_{in}$ to make multiphase voltage-controlled oscillator MVCO generate a plurality of phase signals. The frequency of the plurality of phase signals monotonically increases based on the frequency-up conversion signal UP.

Figure 11:
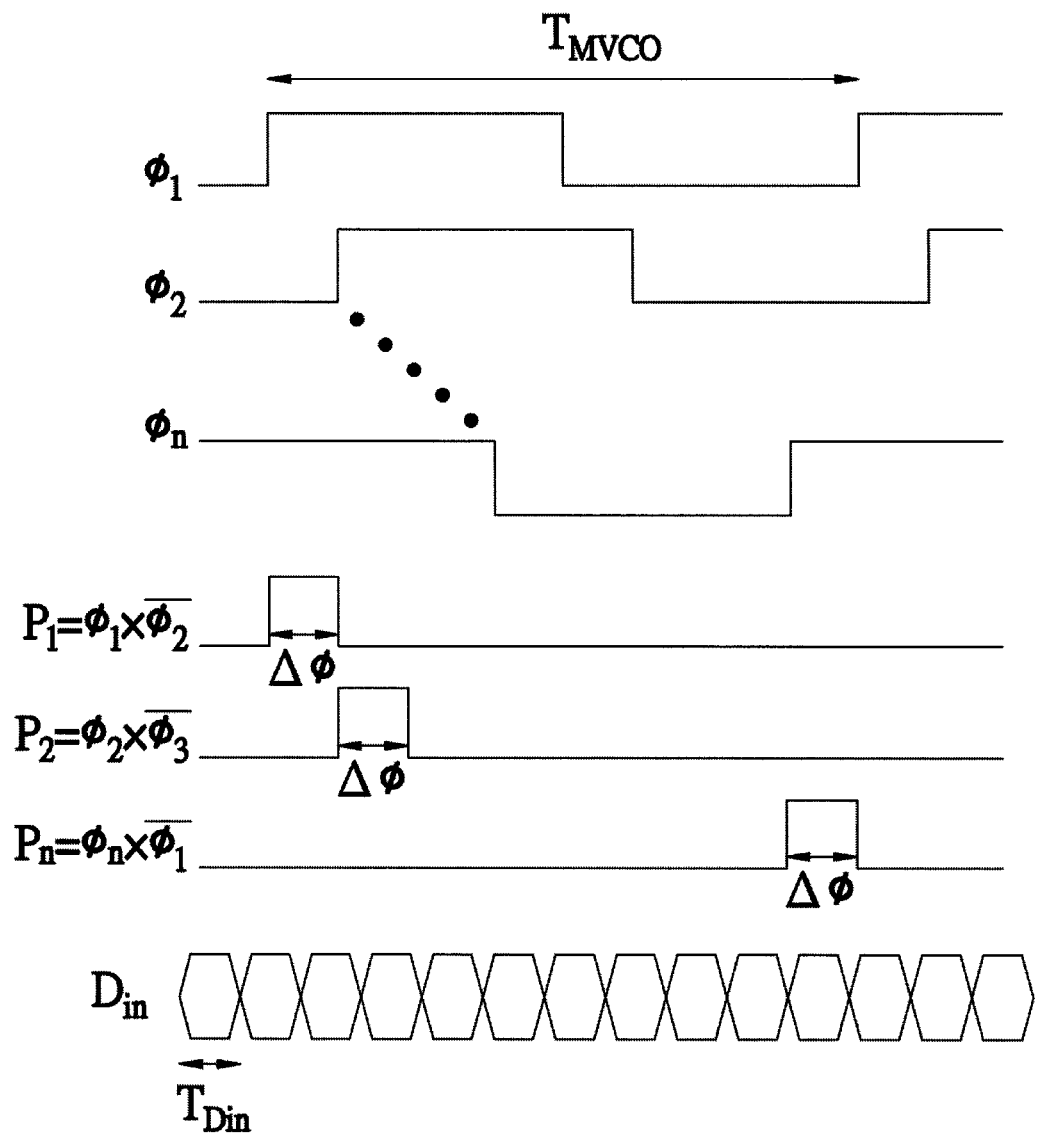
FIG. 11 illustrates a schematic principle diagram of the referenceless clock and data recovery system according to the embodiment of the present invention.

Please further refer to FIG. 11, which illustrates a schematic principle diagram of the referenceless clock and data recovery system according to the embodiment of the present invention. As FIG. 11 illustrated, the multiphase voltage-controlled oscillator MVCO generates n phase signals $\phi_1, \phi_2, \ldots, \phi_n$ and each of the phase signals $\phi_1, \phi_2, \ldots, \phi_n$ are divided into one period $T_{MVCO}$. The phase time difference between each phase signal is denoted by $\Delta\phi$. In the embodiment illustrated by FIG. 11, the pulse signal generator PG generates n pulse signals $P_1, P_2, \ldots, P_n$ and the relation between the pulse signal and the phase signal is as follows: $P_i = \phi_i \cdot \overline{\phi_{i+1}}$. Wherein, n is a positive integer larger than 0 and i equals 0 to n. In the embodiment of the present invention, the pulse signal generator PG may comprise an extraction constituted of a plurality of AND gates.

When one of the pulse signals $P_1, P_2, \ldots, P_n$ encompasses a input data pulse width $T_{Din}$ of the random input data $D_{in}$ ($T_{Din} < \Delta\phi$), the pulse signal determination circuit E2 generates a frequency-up conversion signal UP which controls the multiple phase oscillator MVCO to detect the frequency-up. The determination circuit E2 controls the frequency of the plurality of phase signal generated by the multiple phase oscillator MVCO in the referenceless clock and data recovery system to monotonically increase based on the frequency-up conversion signal UP.

When none of the pulse signals $P_1, P_2, \ldots, P_n$ can encompass the input data pulse width $T_{Din}$ ($\Delta\phi \leq T_{Din}$), the pulse signal determination circuit E2 stop outputting the frequency-up conversion signal UP which controls the multiple phase oscillator MVCO to detect the frequency-up. Hereby, the frequency acquisition of the referenceless clock and data recovery system is achieved.

Figure 12:
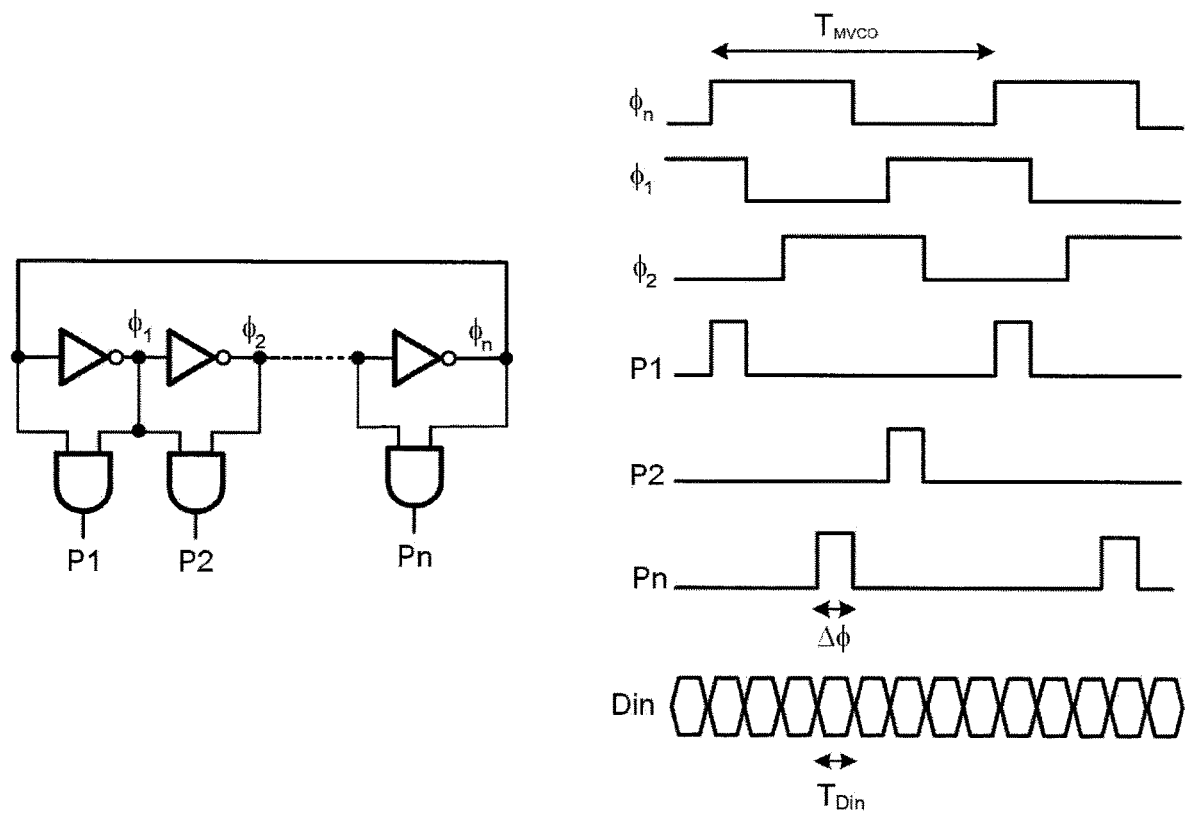
FIG. 12 illustrates a schematic principle diagram of the referenceless clock and data recovery system according to another embodiment of the present invention.

Please further refer to FIG. 12, which illustrates a schematic principle diagram of the referenceless clock and data recovery system according to another embodiment of the present invention. As FIG. 12 illustrated, the multiphase voltage-controlled oscillator MVCO is composed of multiple stages of buffers and generates n phase signals $\phi_1, \phi_2, \phi_n$ and each of the phase signals $\phi_1, \phi_2, \ldots, \phi_n$ are divided into one period $T_{MVCO}$. The phase time difference between each phase signal is denoted by $\Delta\phi$. In the embodiment illustrated by FIG. 12, the pulse signal generator PG generates n pulse signals $P_1, P_2, \ldots, P_n$ by an AND gate, and the relation between the pulse signal and the phase signal is as follows: $P_i = \phi_i \cdot \phi_{i+1}$. Wherein, n is a positive integer larger than 0 and i equals 0 to n.

When one of the pulse signals P1, P2, ..., Pn randomly encompass an input data pulse width TDin ($T_{Din} < \Delta\phi$), the pulse signal determination circuit E2 generates the frequency-up conversion signal UP which controls the multiple phase oscillator MVCO to monotonically increase based on the frequency-up conversion signal UP.

In light of the aforementioned embodiments, the system of referenceless clock and data recovery and frequency detector thereof of the present invention may have the following advantages. The system of referenceless clock and data recovery and frequency detector thereof would not be influenced by the pattern and run length. Additionally, the frequency acquisition error of the system of referenceless clock and data recovery and frequency detector thereof may not be influenced by transition density. Also, the frequency acquisition range of the system of referenceless clock and data recovery and frequency detector thereof may only be limited to the frequency tuning range of a voltage-controlled oscillator. The frequency acquisition range of the system of referenceless clock and data recovery and frequency detector thereof may still conduct frequency acquisition in an environment where the receiving signal is affected by ISI. Finally, the frequency acquisition range of the system of referenceless clock and data recovery and frequency detector thereof may still conduct a Baud Rate operation because there is no need for sampling IQ phase of the clock signal.

The above description is merely illustrative rather than restrictive. Any equivalent modification or alteration without departing from the spirit and scope of the present invention should be included in the appended claims.

What is claimed is:

1. A frequency detector suitable for a clock and data recovery system to monotonically increase a frequency of a clock signal outputted by the clock and data recovery system, the frequency detector comprising:
   an extraction circuit receiving a data signal and generating a data transition signal by distinguishing a plurality of data transition edges of the data signal, and the extraction circuit receiving the clock signal and generating a clock transition signal by distinguishing a plurality of clock transition edges of the clock signal; and
   a determination circuit connected to the extraction circuit, and receiving the data transition signal and the clock transition signal, the determination circuit respectively determining a data signal period of the data signal and a clock signal period of the clock signal based on the data transition signal and the clock transition signal, and the determination circuit determines the period difference by comparing the relative position between the data transition signal and the clock transition signal;
   wherein when the data signal period is lower than a half of the clock signal period, the determination circuit generates a frequency-up conversion signal such that the frequency of the clock signal is increased by the clock and data recovery system according to the frequency-up conversion signal.

2. The frequency detector according to claim 1, wherein the determination circuit defines two of the plurality of data transition edges adjacent to each other as data transition intervals and two of the plurality of clock transition edges adjacent to each other as clock transition intervals based on the data transition signal and the clock transition signal, and when any of the clock transition intervals encompasses the data transition intervals on a time axis, the determination circuit generates the frequency-up conversion signal.

3. The frequency detector according to claim 2, wherein the plurality of data transition edge adjacent is respectively a data rising edge or a data falling edge, whereas the plurality of clock transition edges adjacent are respectively a clock rising edge or a clock falling edge, and when any one of the clock rising edges or the clock falling edges leads the data rising edges or the data falling edges and the clock falling edge or the clock rising edge adjacent to the clock rising edges or the clock falling edges lags the data falling edge or the data rising edge adjacent to the data rising edges or the data falling edges, the determination circuit generates the frequency-up conversion signal.

4. The frequency detector according to claim 3, the determination circuit generates the frequency-up conversion signal when satisfying one of the following conditions or combination thereof as below:
   a first condition: the clock rising edge leads the data rising edge, and the clock falling edge adjacent to the clock rising edge lags the data falling edge adjacent to the data rising edge;
   a second condition: the clock falling edge leads the data rising edge, and the clock rising edge adjacent to the clock falling edge lags the data falling edge adjacent to the data rising edge;
   a third condition: the clock rising edge leads the data falling edge, and the clock falling edge adjacent to the clock rising edge lags the data rising edge adjacent to the data falling edge; and
   a fourth condition: the clock falling edge leads the data falling edge, and the clock rising edge adjacent to the clock falling edge lags the data rising edge adjacent to the data falling edge.

5. The frequency detector according to claim 1, wherein the extraction circuit further comprises:
   a first D flip-flop comprising a first data input terminal, a first clock input terminal, a first temporary data output terminal and a first reset gate, the first data input terminal connected to a high voltage terminal, the first clock input terminal receiving the data signal;
   a first negative-edge-triggered D flip-flop comprising a first negative-edge-triggered D flip-flop data input terminal, a first negative-edge-triggered D flip-flop clock input terminal, a first negative-edge-triggered D flip-flop data output terminal and a first negative-edge-triggered D flip-flop reset gate, the first negative-edge-triggered D flip-flop data input terminal connected to the first temporary data output terminal, the first negative-edge-triggered D flip-flop clock input terminal receiving the data signal;
   a second D flip-flop comprising a second data input terminal, a second clock input terminal, a second temporary data output terminal and a second reset gate, the second data input terminal connected to the high voltage terminal, the second clock input terminal receiving the clock signal, the first reset gate connected to the second reset gate;
   a second negative-edge-triggered D flip-flop comprising a second negative-edge-triggered D flip-flop data input terminal, a second negative-edge-triggered D flip-flop clock input terminal, a second negative-edge-triggered D flip-flop data output terminal and a second negative-edge-triggered D flip-flop reset gate, the second negative-edge-triggered D flip-flop data input terminal connected to the second temporary data output terminal, the second negative-edge-triggered D flip-flop clock input terminal receiving the clock signal, the second negative-edge-triggered D flip-flop reset gate connected to the first negative-edge-triggered D flip-flop reset gate; and
   a first AND gate provided with a first AND gate first input terminal, a first AND gate second input terminal and a first AND gate output terminal, the first AND gate first input terminal connected to the first negative-edge-triggered D flip-flop data output terminal, the first AND gate second input terminal connected to the second negative-edge-triggered D flip-flop data output terminal, the first AND gate output terminal connected to the first reset gate, the second reset gate, the first negative-edge-triggered D flip-flop reset gate and the second negative-edge-triggered D flip-flop reset gate.

6. The frequency detector according to claim 5, wherein the determination circuit further comprises:
   a third D flip-flop comprising a third data input terminal, a third clock input terminal, a third temporary data output terminal and a third reset gate, the third data input terminal connected between the second temporary data output terminal and the second negative-edgetriggered D flip-flop data input terminal, the third clock input terminal connected between the first temporary data output terminal and the first negative-edge-triggered D flip-flop data input terminal;

a fourth D flip-flop comprising a fourth data input terminal, a fourth clock input terminal, a fourth temporary data output terminal and a fourth reset gate, the fourth data input terminal connected between the first negative-edge-triggered D flip-flop data output terminal and the first AND gate first input terminal, the fourth clock input terminal connected between the second negative-edge-triggered D flip-flop data output terminal and the first AND gate second input terminal and the third reset gate connected to the fourth reset gate; and a second AND gate provided with a second AND gate first input terminal, a second AND gate second input terminal and a second AND gate output terminal, the second AND gate second input terminal connected to the third temporary data output terminal, the second AND gate first input terminal connected to the fourth temporary data output terminal, and the second AND gate output terminal outputting the frequency-up conversion signal.

7. A referenceless clock and data recovery system comprising:

a voltage-controlled oscillator generating a clock signal;

an extraction circuit receiving a data signal and generating a data transition signal by distinguishing a plurality of data transition edges of the data signal, and the extraction circuit receiving the clock signal and generating a clock transition signal by distinguishing a plurality of clock transition edges of the clock signal; and a determination circuit connected to the extraction circuit and receiving the data transition signal and the clock transition signal, the determination circuit respectively determining a data signal period of the data signal and a clock signal period of the clock signal based on the data transition signal and the clock transition signal, and the determination circuit determines the period difference by comparing the relative position between the data transition signal and the clock transition signal;

wherein when the data signal period is lower than a half of the clock signal period, the determination circuit generates a frequency-up conversion signal and provides the frequency-up conversion signal to the voltage-controlled oscillator, such that the frequency of the clock signal generated by the voltage-controlled oscillator is monotonically increased according to the frequency-up conversion signal.

8. The referenceless clock and data recovery system according to claim 7, wherein the determination circuit defines two of the plurality of data transition edges adjacent to each other as data transition intervals and two of the plurality of clock transition edges adjacent to each other as clock transition intervals, and when any of the clock transition intervals encompasses the data transition intervals on the time axis, the determination circuit generates the frequency-up conversion signal.

9. The referenceless clock and data recovery system according to claim 8, wherein the plurality of data transition edges adjacent to each other are respectively a data rising edge or a data falling edge, whereas the plurality of clock transition edge adjacent to each other are respectively a clock rising edge or a clock falling edge, and when any one of the clock rising edge or the clock falling edge leads the data rising edge or the data falling edge and the clock falling edge or the clock rising edge adjacent to the clock rising edge or the clock falling edge lags the data falling edge or the data rising edge adjacent to the data rising edge or the data falling edge, the determination circuit generates the frequency-up conversion signal.

10. The referenceless clock and data recovery system according to claim 9, the determination circuit generates the frequency-up conversion signal when satisfying one of the following conditions or combination thereof as below:

a first condition: the clock rising edge leads the data rising edge, and the clock falling edge adjacent to the clock rising edge lags the data falling edge adjacent to the data rising edge;

a second condition: the clock falling edge leads the data falling edge, and the clock rising edge adjacent to the clock falling edge lags the data falling edge adjacent to the data rising edge;

a third condition: the clock rising edge leads the data rising edge, and the clock falling edge adjacent to the clock rising edge lags the data rising edge adjacent to the data falling edge; and a fourth condition: the clock falling edge leads the data falling edge, and the clock rising edge adjacent to the clock falling edge lags the data rising edge adjacent to the data falling edge.

11. A referenceless clock and data recovery system comprising:

a multiple phase oscillator generating a plurality of phase signals during a period of time;

a pulse signal generator generating a plurality of pulse signals based on the plurality of phase signals; and a pulse signal determination circuit communicatively connected to the pulse signal generator and receiving a data signal;

wherein the pulse signal determination circuit compares the relative position between the plurality of pulse signals and the data signal, when a pulse width of the pulse signal encompasses a data pulse signal of the data signal, the pulse signal determination circuit generates and provides a frequency-up conversion signal to the multiple phase oscillator, such that a frequency of the plurality of phase signal generated by the multiple phase oscillator is monotonically increased according to the frequency-up conversion signal.

12. The referenceless clock and data recovery system according to claim 11, wherein the pulse signal generator comprises an extraction circuit constituted of a plurality of AND gates.

* * * * *